June 20, 1967 J. R. WILLIAMS 3,327,181

EPITAXIAL TRANSISTOR AND METHOD OF MANUFACTURE

Filed March 24, 1964

INVENTOR.
JOHN R. WILLIAMS
BY David A. Rich
ATTORNEY

United States Patent Office 3,327,181

Patented June 20, 1967

3,327,181

EPITAXIAL TRANSISTOR AND METHOD OF MANUFACTURE

John R. Williams, Natick, Mass., assignor to Crystalonics, Inc., Cambridge, Mass., a corporation of Massachusetts Filed Mar. 24, 1964, Ser. No. 354,272
9 Claims. (Cl. 317—235)

The present invention relates to semiconductor devices and their methods of manufacture. More especially, the invention relates to transistors.

In the prior art both NPN and PNP transistors have been manufactured of silicon and germanium. Such prior art transistors suffer from high leakage currents, are limited to relatively low operating voltages, have a relatively high saturation resistance and are limited in operating temperature range.

In operating characteristics, prior art transistors are typically limited in amplification factor, the so-called beta characteristics.

The cost of manufacturing relatively high performance transistors is very great; for example, yields as low as one percent (1%) are not unusual. That is to say, it frequently requires the production of one hundred (100) transistors in order to obtain one (1) useful transistor.

It is therefore a principal object of the invention to provide an improved semiconductor device exhibiting extremely low leakage currents.

A further object of the invention is to provide an improved semiconductor device capable of higher operating voltages.

Still another object of the invention is to provide an improved semiconductor device exhibiting a relatively high amplification characteristic.

Yet another object of the invention is to provide an improved semiconductor device operable over a relatively broad temperature range.

Still another object of the invention is to provide an improved semiconductor device operable at relatively high frequencies.

Yet another object of the invention is to provide an improved semiconductor device that is reliable in operation.

A still further object of the invention is to provide an improved semiconductor device which can be manufactured economically.

In accordance with the invention, there is provided a semiconductor device. The device includes a semiconductor, single crystal base layer having uniform resistivity. The base layer includes an impurity to provide one polarity type conductivity. The orientation of the crystal is selected and is preferably [1, 1, 1]. A collector layer of single crystal semiconductor material is epitaxially formed to provide a rectifying junction with the base layer along juxtaposed surfaces. The collector layer is characterized by a polarity type conductivity opposite the base type. An emitter rectifying junction is formed of emitter material diffused into the base. The emitter is characterized by a polarity type conductivity opposite the base type. Ohmic contacts are bonded to the emitter, base and collector for providing output terminals for the semiconductor device.

Other and further objects of the invention will be apparent from the following description of the invention, taken in connection with the accompanying drawings, and its scope will be pointed out in the appended claims.

Figure 1:
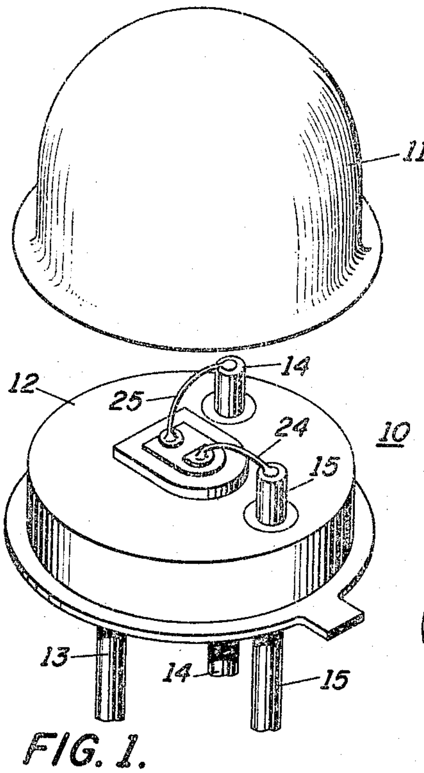
FIG. 1 is a perspective view of a semiconductor device embodying the invention.
Figure 2:
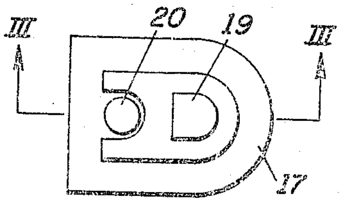
FIG. 2 is a plan view of a semiconductor element embodying the invention, for clarity the connection wires are not shown.
Figure 3:
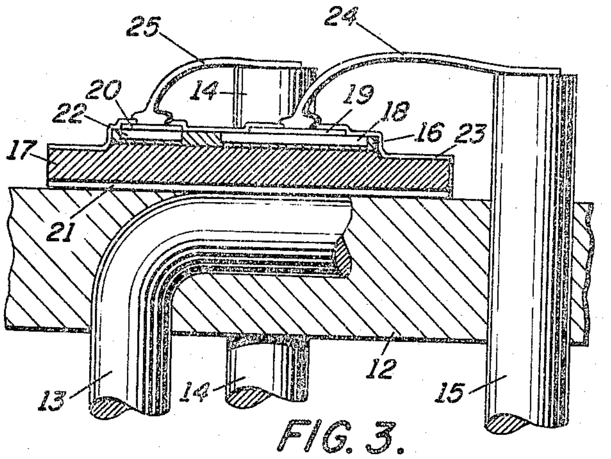
FIG. 3 is a side-sectional view of the element in FIG. 2 taken along the lines III—III.

Referring now to the drawings and with particular reference to FIGS. 1–3 there is here illustrated a semiconductor device embodying the invention. For purposes of illustration and description, a type PNP silicon transistor has been chosen as the preferred embodiment. The invention has application however, to germanium and other crystalline semiconductor materials as well, it will be further apparent that the invention has application to type NPN silicon transistors as well as other devices, such as, NPNP, PNP-NPN, etc.

The semiconductor device of the invention is generally indicated at 10. The transistor is enclosed within a sealed cap 11 and insulated header 12. Extending from the header 12 are output terminal leads 13, 14 and 15 ohmically connected to the collector, base and emitter contacts, respectively, of the transistor. The collector 17 is epitaxially formed by crystal growth on the surface of the base 16. Diffused into the base 16 is the emitter 18. Ohmic contact surfaces 19, 20 and 21 are deposited on the emitter 18, base 16 and collector 17, respectively.

The base is formed of N type silicon having an impurity for example, of phosphorous of the order of $10^{17}$ atoms per cc. The relation between impurity concentration and resistivity may be found in a publication entitled Transistor Engineering, authored by Alvin B. Phillips, published by McGraw-Hill, 1962, on page 76, FIGS. 4–10. This provides a relatively high resistivity base material which varies in resistivity depending upon the application. For low transistor operating voltages, the resistivity may be approximately 1 to 3 ohm-centimeters. For high voltage applications, for example 70 volts, the resistivity may be 1,000 ohm-centimeters or higher corresponding with an impurity concentration of less than $10^{14}$ atoms per cubic centimeter of silicon. Beneath the contact 20 is a base connection area 22 which has a very low resistivity by virtue of a much higher concentration of impurity, for example, $10^{20}$ phosphorous atoms per cubic centimeter of silicon. The emitter area 18 varies in resistivity due to the variation of boron diffusion from approximately $10^{20}$ atoms of boron per cc. of silicon adjacent the contact 19 down to approximately $10^{17}$ atoms per cc. at the junction with the base corresponding with resistivities of less than .01 to .26 ohm-centimeters, respectively. A layer of silicon oxide coating 23 surrounds the exposed areas of the transistor as shown. Wires 24, preferably formed of gold, are connected from the emitter contact 19 to the terminal lead 15 and from the base contact 20 to the terminal lead 14. The collector 17 is formed of relatively high impurity P type material having for example, $10^{20}$ atoms of boron per cc. of silicon to provide a low resistivity path to the junction corresponding to less than .01 ohm-centimeter resistivity. The terminal 13 is shaped to provide a direct contact to the bottom of the collector 17. The header 12 is preferably formed of an insulating material to enable the connection of a relatively high operating voltage on the collector 17. For grounded collector operation the header 12 may be formed of a conductive material and the collector 17 directly connected to it.

Figure 4:
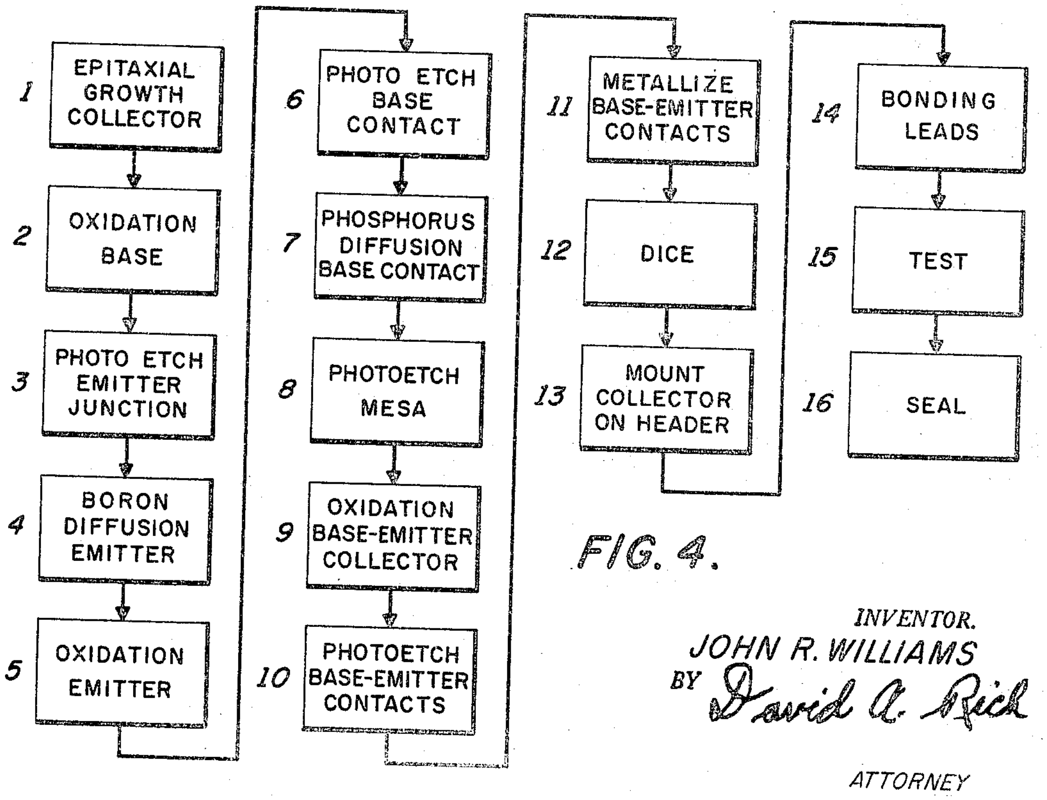
FIG. 4 is a process flow diagram illustrating the method of manufacture of the invention.

*Description of the method of the invention as shown in FIG. 4*

Referring now to FIG. 4 there is here illustrated a flow diagram for the method of manufacture of the invention. A sheet of commercially available N type silicon, for example .007 inch thick, formed from a single crystal having [1, 1, 1] orientation is used as the substrate material and will be the base of the transistor. This material has an impurity, for example of phosphorous, to the extent of approximately $10^{17}$ atoms of phosphorous per cc. of silicon, providing a relatively high resistivity.

*Step 1: Epitaxial growth collector.*—The collector layer is epitaxially grown on the base material to a thickness of the order of approximately .010 inch and is formed from P type material having, for example, a boron impurity of the order of $10^{20}$ to $10^{21}$ atoms of boron per cubic centimeter of silicon. The epitaxial layer formed has the same orientation [1, 1, 1] as the base material. After the collector layer has been formed, the base layer is etched down to a thicknes sof .0005 to .001 inch in an acid solution of a combination of acetic, nitric and hydrofluoric acids.

Epitaxial growth may be accomplished in accordance with the procedures of a number of conventional techniques. For example in The Art and Science of Growing Crystals, edited by J. J. Gilman and published by John Wiley & Sons in 1963, the term epitaxial is defined as a layer of solid material whose crystal structure and orientation are determined by the lattice of the substrate or seed crystal on which it lies. In general, epitaxial growth may be accomplished with either a solid and a liquid or a solid and a gas. Epitaxial growth techniques for silicon are outlined in chapter 5 of the publication, pages 80–92.

*Step 2: Oxidation-base.*—The base region is oxidized by exposure to oxygen, bubbled through water, at 1100° centigrade.

*Step 3: Photo-etch-emitter.*—Using the well-known photo-etching techniques, the base layer is covered with a photo-resist, masked, exposed to light, developed and baked to provide an exposed area of oxide in the shape of the emitter. The sheet is then exposed to an etching bath of ammonium bifluoride solution which attacks only the oxide and to which the silicon is impervious. Thus, a window is formed in the oxide in the shape of the emitter as shown particularly in FIG. 2.

*Step 4: Boron diffusion-emitter.*—Boron is diffused by vapor deposition into the silicon base through the exposed emitter area for one-half (½) hour at a temperature of 1100° centigrade. Vaporized boron is introduced mixed with nitrogen. After the one half (½) hour period, the boron is allowed to diffuse for two (2) hours at 1100° centigrade. Wet oxygen is used as a gas during the boron diffusion. During the diffusion the oxide seals the emitter. The oxide formed in this manner is a boron silicate which must be removed by etching in a solution of hydrogen fluoride.

*Step 5: Oxidation-emitter.*—A new oxide layer is provided by repeating the procedure outlined above and oxidizing the sheet to form a pure silicon dioxide coating.

*Step 6: Photo-etch-base contact.*—In the manner of Step 3 above, the oxide coating is photo-etched to expose base silicon in the shape of the base contact area shown in FIG. 2.

*Step 7: Phosphorous diffusion-base contact.*—Phosphorous is diffused into the base contact area by vapor deposition at a tempearture of 900° centigrade for one-half (½) hour.

*Step 8: Photo-etch mesa.*—In the manner of Step 3, the mesa area is photo-etched in a solvent for silicon, an acid solution of acetic, nitric and hydrofluoric acids.

*Step 9: Oxidation-mesa.*—The sheet is then oxidized in the manner of Step 2 above.

*Step 10: Photo-etch base and emitter contacts.*—In the manner of Step 3, the oxide layer is photo-etched to expose the base and emitter contact areas as shown in FIG. 2.

*Step 11: Metallized base and emitter contacts.*—The sheet is placed in a nickel plating solution to metallize the exposed base and emitter contact areas.

*Step 12: Dice.*—The sheet is cut up into individual transistors.

*Step 13: Mounting on headers.*—The transistors are mounted on the header by welding or adhesive techniques.

*Step 14: Bonding of leads.*—The terminal leads are bonded to the wires from the base and emitter contacts.

*Step 15: Test.*—Before the cap is placed on the header, the unit is tested for electrical operating characteristics.

*Step 16: Seal.*—The cap is applied and sealed to the header.

By avoiding the double diffusion of the prior art, uniform resistivity of the base and collector regions are obtained and very careful control over the diffusion of the emitter becomes possible.

Transistors having the structure of and manufactured in accordance with the method of the present invention are demonstrably superior to those of the prior art. In particular, such transistors have a leakage current less than .01 nano ampere at 25° centigrade and in fact, have been measured as low as $10^{-12}$ ampere. The noise characteristic approaches thermal noise as a lower limit and typically have a noise figure of two (2) db.

It will be apparent that the semiconductor device of the present invention is broadly applicable to a wide range of circuit applications.

While there has hereinbefore been described what is at present considered to be preferred embodiment of the invention, it will be apparent to those of ordinary skill in the art that many and various changes and modifications may be made with respect to the embodiment described and illustrated without departing from the spirit of the invention. It will be understood, therefore, that all such changes and modifications as fall fairly within the scope of the present invention, as defined in the appended claims, are to be considered as a part of the present invention.

What is claimed is:

1. A transistor, comprising:

a semiconductor, single crystal layer base having an impurity to provide one polarity type conductivity of uniform relatively high resistivity of at least .1 ohm-centimeter;

a base contact area formed of a higher concentration of said one polarity type conductivity impurity to provide a relatively low resistivity contact area of less than .01 ohm-centimeter;

a collector layer of single crystal semiconductor material having a selected crystallographic axis orientation and in epitaxial rectifying junction with said base layer along juxtaposed surfaces, said collector layer having an impurity to provide a polarity type conductivity opposite said base type to provide relatively low resistivity of less than .01 ohm-centimeter;

an emitter formed in said base and having said opposite polarity type conductivity impurity concentration to provide a rectifying junction with said base, a mesa region upraised from said collector layer and including said base and emitter;

an oxide coating covering selected exposed surfaces of said collector, base and emitter; and ohmic contacts coupled to said emitter, base contact area and collector for providing output terminals for said transistor.

2. The transistor of claim 1, wherein:

said base and collector layers are formed of silicon.

3. The transistor of claim 1, wherein:

said transistor has PNP conductivity types.

4. The transistor of claim 1, wherein:

the resistivity of said collector is substantially uniform.

5. The transistor of claim 1, wherein:

the resistivity of said emitter is less than .01 ohm-centimeter.

6. A PNP silicon transistor, comprising:

a relatively thin D-shaped silicon semiconductor, single crystal layer base of uniform resistivity having an impurity to provide N-type conductivity, the orientation of said crystal being [1, 1, 1], said base having an N-type impurity concentration to provide a resistivity of at least .1 ohm-centimeter.

a base contact area formed of an N-type impurity concentration diffused into said base to provide a low resistivity contact area of less than .01 ohm-centimeter.

a relatively thick, D-shaped collector layer of single crystal P-type conductivity silicon material oriented [1, 1, 1] and epitaxially formed in epitaxial rectifying junction with said base layer along juxtaposed surfaces;

an emitter formed of P-type silicon diffused into said base to provide a rectifying junction with said base, a D-shaped mesa region upraised from said collector layer and including said base and emitter;

a circular, metallic base contact formed on said base contact area;

a D-shaped, metallic emitter contact formed on said emitter;

a coating of silicon dioxide covering selected exposed surfaces of said collector, base and emitter; and terminal connectors bonded to said emitter and base contacts and said collector for providing output terminals for said transistor.

7. The transistor of claim 6, wherein:

the resistivity of said collector is substantially uniform and relatively low, being less than .01 ohm-centimeter.

8. A PNP silicon transistor, comprising:

a silicon semiconductor, single crystal layer base of uniform resistivity having an impurity to provide N-type conductivity, the orientation of said crystal being [1, 1, 1], said base having an N-type impurity concentration in the order of $10^{17}$ atoms per cubic centimeter of silicon;

a base contact area formed of an N-type impurity concentration in the order of $10^{21}$ atoms per cubic centimeter of silicon diffused into said base to provide a low resistivity contact area;

a collector layer of single crystal P-type conductivity silicon material oriented [1, 1, 1] and epitaxially formed on said base to provide a rectifying junction with said base layer along juxtaposed surfaces, said collector having a P-type impurity concentration in the order of $10^{21}$ atoms per cubic centimeter of silicon to provide uniform low resistivity;

an emitter formed of P-type silicon diffused into said base to provide a rectifying junction with said base; and ohmic contacts bonded to said emitter, base contact area and collector for providing output terminals for said transistor.

9. A PNP silicon transistor, comprising:

a relatively thin D-shaped silicon semiconductor, single crystal layer base of uniform resistivity having an impurity to provide N-type conductivity, the orientation of said crystal being [1, 1, 1], said base having an N-type impurity concentration in the order of $10^{17}$ atoms per cubic centimeter of silicon;

a base contact area formed of an N-type impurity concentration in the order of $10^{21}$ atoms per cubic centimeter of silicon diffused into said base to provide a low resistivity contact area;

a relatively thick, D-shaped collector layer of single crystal P-type conductivity silicon material oriented [1, 1, 1] and epitaxially formed on said base to provide a rectifying junction with said base layer along juxtaposed surfaces, said collector having a P-type impurity concentration in the order of $10^{21}$ atoms per cubic centimeter of silicon to provide uniform low resistivity;

an emitter formed of P-type silicon diffused into said base to provide a rectifying junction with said base, a D-shaped mesa region upraised from said collector layer and including said base and emitter;

a circular, metallic base contact formed on said base contact area;

a D-shaped, metallic emitter contact formed on said emitter;

a coating of silicon dioxide covering selected exposed surfaces of said collector, base and emitter; and terminal connectors bonded to said emitter and base contacts and said collector for providing output terminals for said transistor.

References Cited

UNITED STATES PATENTS

| | | | |
|---|---|---|---|
| 3,092,522 | 6/1963 | Knowles et al. | 29—25.3 |
| 3,164,498 | 1/1965 | Loeb et al. | 148—175 |
| 3,165,811 | 1/1965 | Kleimack et al. | 317—235 |
| 3,198,999 | 8/1965 | Baker et al. | 317—235 |
| 3,211,972 | 10/1965 | Kilby et al. | 317—235 |
| 3,233,305 | 2/1966 | Dill | 317—235 |
| 3,260,624 | 7/1966 | Wiesner | 317—235 |
| 3,275,910 | 9/1966 | Phillips | 317—235 |

FOREIGN PATENTS

39–7227 5/1964 Japan.

JOHN W. HUCKERT, *Primary Examiner.*

J. D. CRAIG, *Assistant Examiner.*